US012794476B2

(12) United States Patent
Li et al.

(10) Patent No.: US 12,794,476 B2
(45) Date of Patent: Nov. 10, 2026

(54) LEVEL SHIFTER CIRCUIT AND ACCELERATING SWITCH CIRCUIT

(71) Applicant: Nuvoton Technology Corporation, Hsinchu Science Park (TW)

(72) Inventors: Cheng-Tao Li, Hsinchu Science Park (TW); Hao Li, Hsinchu City (TW)

(73) Assignee: Nuvoton Technology Corporation, Hsinchu Science Park (TW)

( * ) Notice: Subject to any disclaimer, the term of this patent is extended or adjusted under 35 U.S.C. 154(b) by 0 days.

(21) Appl. No.: 19/234,657

(22) Filed: Jun. 11, 2025

(65) Prior Publication Data

US 2026/0031816 A1 Jan. 29, 2026

(30) Foreign Application Priority Data

Jul. 25, 2024 (TW) ................................ 113127661

(51) Int. Cl.
*H03K 19/0185* (2006.01)
*H03K 17/0412* (2006.01)

(52) U.S. Cl.
CPC ............... *H03K 19/018521* (2013.01); *H03K 17/04123* (2013.01)

(58) Field of Classification Search
CPC ................ H03K 19/018521; H03K 17/04123
USPC ........................................................ 327/333
See application file for complete search history.

(56) References Cited

U.S. PATENT DOCUMENTS

2005/0275429 A1* 12/2005 Khan .............. H03K 3/356008 326/81

* cited by examiner

*Primary Examiner* — Tomi Skibinski
(74) *Attorney, Agent, or Firm* — MUNCY, GEISSLER, OLDS & LOWE, P.C.

(57) ABSTRACT

A level shifter circuit including a bias-voltage generation circuit, a charge-discharge balancer circuit, a first high-voltage NMOS transistor, a second high-voltage NMOS transistor, a low-voltage processing circuit, and a high-voltage processing circuit is provided. The bias-voltage generation circuit generates a stable voltage. The charge-discharge balancer circuit generates a first control voltage and a second control voltage based on the stable voltage, a first processed signal, and a second processed signal. The first high-voltage NMOS transistor receives the first control voltage and a third processed signal. The second high-voltage NMOS transistor receives the second control voltage and a fourth processed signal. The low-voltage processing circuit processes an input signal to provide the first, second, third, and fourth processed signals. The high-voltage processing circuit generates an output signal based on the drain voltage of the first high-voltage NMOS transistor and the drain voltage of the second high-voltage NMOS transistor.

20 Claims, 5 Drawing Sheets

LEVEL SHIFTER CIRCUIT AND ACCELERATING SWITCH CIRCUIT

CROSS REFERENCE TO RELATED APPLICATIONS

This application claims priority of Taiwan Patent Application No. 113127661, filed on Jul. 25, 2024, the entirety of which is incorporated by reference herein.

BACKGROUND OF THE INVENTION

Field of the Invention

The present invention relates to a level shifter circuit, and, in particular, it relates to a level shifter circuit for quickly switching high-voltage components.

Description of the Related Art

The types and functions of electronic devices have increased as technology has developed. Although high-voltage components manufactured using high-voltage processes can withstand high operation voltages, they have high power consumption. To reduce the power consumption of electronic devices, the electronic devices have many low-voltage components manufactured using low-voltage processes. However, most electronic devices have high-voltage components and low-voltage components. When a low operation voltage is used to drive a high-voltage component, the high-voltage component may not operate, or it may operate with a delay, thereby affecting the proper operation of the electronic device.

BRIEF SUMMARY OF THE INVENTION

In accordance with an embodiment of the present invention, a level shifter circuit comprises a bias-voltage generation circuit, a charge-discharge balancer circuit, a first high-voltage NMOS transistor, a second high-voltage NMOS transistor, a low-voltage processing circuit, and a high-voltage processing circuit. The bias-voltage generation circuit generates a stable voltage based on a first operation voltage and a second operation voltage. The charge-discharge balancer circuit generates a first control voltage based on the stable voltage and a first processed signal and generates a second control voltage based on the stable voltage and a second processed signal. The first high-voltage NMOS transistor comprises a gate receiving the first control voltage and further comprises a source receiving a third processed signal. The second high-voltage NMOS transistor comprises a gate receiving the second control voltage and further comprises a source receiving a fourth processed signal. The low-voltage processing circuit receives the second operation voltage and processes an input signal to provide the first processed signal, the second processed signal, the third processed signal, and the fourth processed signal. The high-voltage processing circuit receives the first operation voltage and generates an output signal based on the voltage of the drain of the first high-voltage NMOS transistor and the voltage of the drain of the second high-voltage NMOS transistor. The phase of the first processed signal and the phase of the fourth processed signal are the opposite of the phase of the input signal. The phase of the second processed signal and the phase of the third processed signal are the same as the phase of the input signal.

In accordance with another embodiment of the present invention, an accelerating switch circuit controls a first high-voltage NMOS transistor and a second high-voltage NMOS transistor and comprises a bias-voltage generation circuit, a charge-discharge balancer circuit, and a processing circuit. The bias-voltage generation circuit generates a stable voltage based on a first operation voltage and a second operation voltage. The charge-discharge balancer circuit generates a first control voltage based on the stable voltage and a first processed signal, and generates a second control voltage based on the stable voltage and a second processed signal. The processing circuit receives the second operation voltage and processes an input signal to generate the first processed signal, the second processed signal, a third processed signal, and a fourth processed signal. The gate of the first high-voltage NMOS transistor receives the first control voltage. The source of the first high-voltage NMOS transistor receives the third processed signal. The gate of the second high-voltage NMOS transistor receives the second control voltage. The source of the second high-voltage NMOS transistor receives the fourth processed signal. The phase of the first processed signal and the phase of the fourth processed signal are the opposite of the phase of the input signal. The phase of the second processed signal and the phase of the third processed signal are the same as the phase of the input signal.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
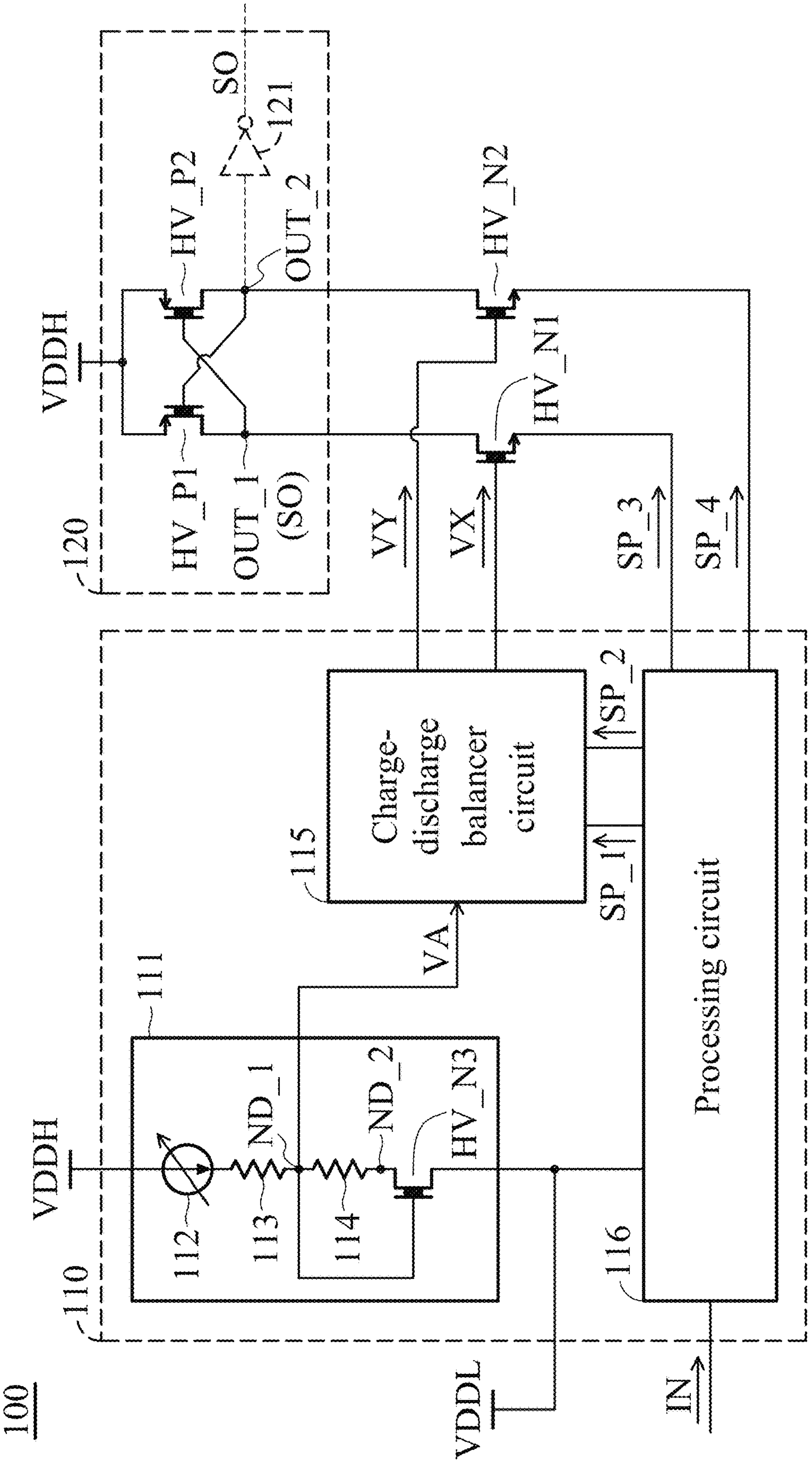
FIG. 1 is a schematic diagram of an exemplary embodiment of an accelerating switch circuit based on various aspects of the present invention.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the present invention.

FIG. 1 is a schematic diagram of an exemplary embodiment of an accelerating switch circuit based on various aspects of the present invention. The accelerating switch circuit 110 is coupled to high-voltage NMOS transistors HV_N1 and HV_N2 and generates control voltages VX and VY, processed signals SP_3 and SP_4. The gate of the high-voltage NMOS transistor HV_N1 receives the control voltage VX. The source of the high-voltage NMOS transistor HV_N1 receives the processed signal SP_3. The gate of the high-voltage NMOS transistor HV_N2 receives the control voltage VY. The source of the high-voltage NMOS transistor HV_N2 receives the processed signal SP_4.

The accelerating switch circuit 110 utilizes the control voltage VX and the processing signal SP_3 to quickly switch the operating state of the high-voltage NMOS transistor HV_N1 and utilizes the control voltage VY and the processing signal SP_4 to quickly switch the operating state of the high-voltage NMOS transistor HV_N2. Taking the high-voltage NMOS transistor HV_N1 as an example, the high-voltage NMOS transistor HV_N1 quickly enters a turn-on stage from a turn-off stage or quickly enters the turn-off stage from the turn-on stage based on the control voltage VX and the processed signal SP_3.

In this embodiment, the accelerating switch circuit 110 comprises a bias-voltage generation circuit 111, a charge-discharge balancer circuit 115, and a processing circuit 116. The bias-voltage generation circuit 111 generates a stable voltage VA based on the operation voltages VDDH and VDDL. In this embodiment, the bias-voltage generation circuit 111 comprises a current source 112, resistors 113 and 114, and a high-voltage NMOS transistor HV_N3. The current source 112 receives the operation voltage VDDH. In one embodiment, the current source 112 is a variable current source. The resistor 113 is coupled between the current source 112 and the node ND_1. The resistor 114 is coupled between the nodes ND_1 and ND_2. The high-voltage NMOS transistor HV_N3 is coupled to the node ND_2 and receives the operation voltage VDDL.

In some embodiment, the stable voltage VA is relative to the resistances of the resistors 113 and 114 and the current IA generated by the current source 112. For example, the stable voltage VA is expressed by the following equation:

$$VA = [(VDDL + Vth)] \pm (IA \cdot R),$$

wherein the symbol Vth represents the threshold voltage of the high-voltage NMOS transistor HV_N3, the symbol IA represents the current provided by the current source 112, and the symbol R represents the resistance of the resistor 114.

The charge-discharge balancer circuit 115 generates the control voltage VX based on the stable voltage VA and a processed signal SP_1 and generates the control voltage VY based on the stable voltage VA and another processed signal SP_2. In this embodiment, the charge-discharge balancer circuit 115 provides the control voltage VX to the gate of the high-voltage NMOS transistor HV_N1 and provides the control voltage VY to the gate of the high-voltage NMOS transistor HV_N2.

Figure 2:
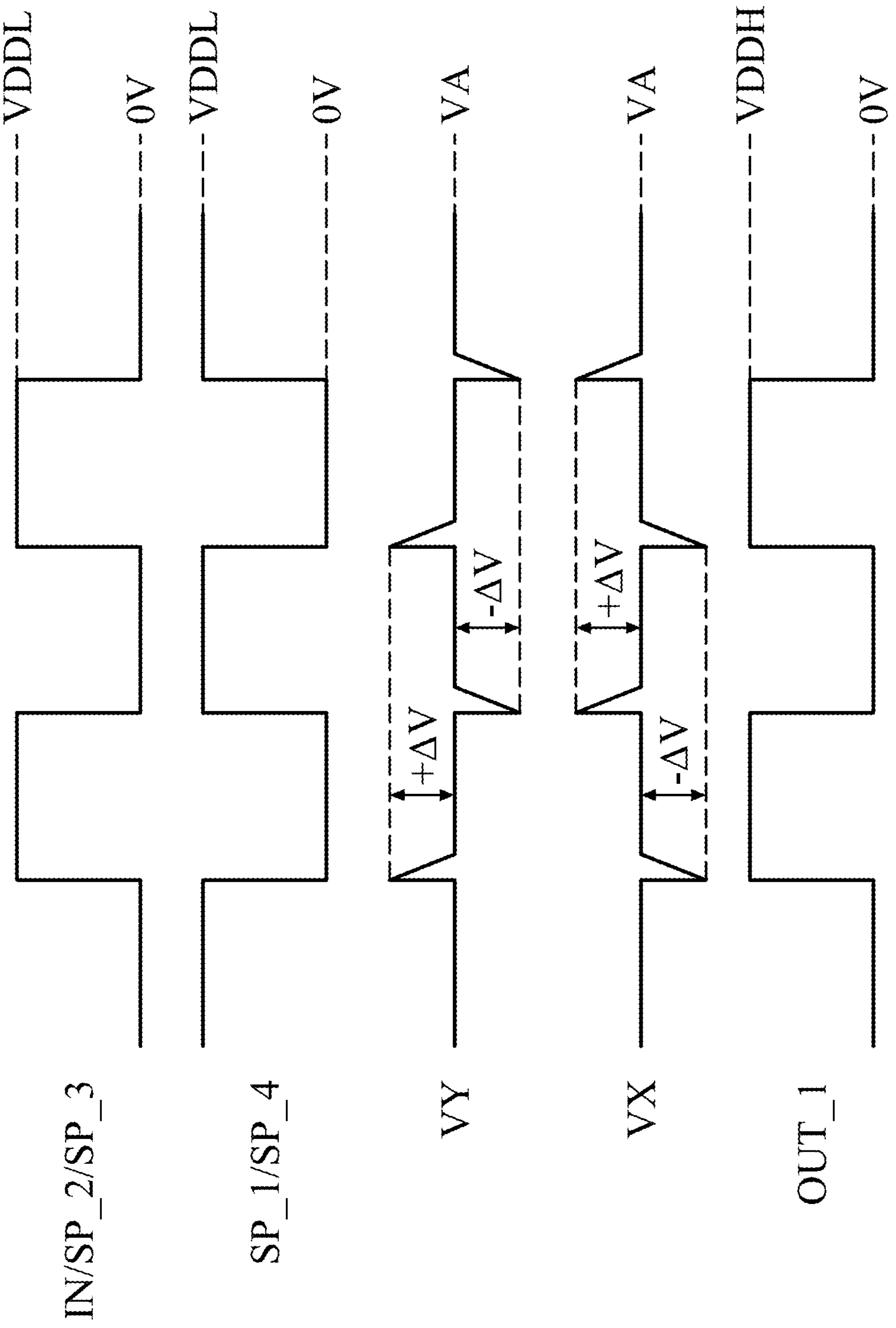
FIG. 2 is an operation schematic diagram of an exemplary embodiment of a level shifter circuit based on various aspects of the present invention.

FIG. 2 shows the level changes of the control voltages VX and VY. Taking the control voltage VY as an example, the charge-discharge balancer circuit 115 uses the stable voltage VA as the control voltage VY. When the input signal IN is changed from a low level (e.g., 0V) to a high level (e.g., VDDL), since the high-voltage NMOS transistor HV_N2 needs to be turned on, the charge-discharge balancer circuit 115 applies a positive pulse to the control voltage VY to quickly turn on the high-voltage NMOS transistor HV_N2. When the level of the input signal IN stabilizes at the high level, the control voltage VY gradually decreases until it is equal to the stable voltage VA.

When the input signal IN is changed from a high level (e.g., LDDL) to a low level (e.g., 0V), since the high-voltage NMOS transistor HV_N2 does not need to be turned on, the charge-discharge balancer circuit 115 applies a negative pulse to the control voltage VY to quickly turn off the high-voltage NMOS transistor HV_N2. When the level of the input signal IN stabilizes at the low level, the control voltage VY gradually increases and returns to the stable voltage VA.

As shown in FIG. 2, the charge-discharge balancer circuit 115 applies a short positive pulse and a short negative pulse at the moment when the level of the input signal IN changes, and then the control voltage VX or VY gradually becomes equal to the stable voltage VA. Since the high-voltage NMOS transistors HV_N1 and HV_N2 are components manufactured using high-voltage processes, even if the gate voltage is slightly higher than the stable voltage VA, the high-voltage NMOS transistors HV_N1 and HV_N2 will not be damaged. Furthermore, when the charge-discharge balancer circuit 115 applies a negative pulse to the gates of the high-voltage NMOS transistors HV_N1 and HV_N2, the high-voltage NMOS transistors HV_N1 and HV_N2 can respond immediately.

The processing circuit 116 receives the operation voltage VDDL and processes the input signal IN to generate the processed signals SP_1~SP_4. Since the operation voltage VDDL is lower than the operation voltage VDDH, the processing circuit 116 is referred to as a low-voltage area circuit. In one embodiment, the phase of the processed signal SP_1 is the opposite of the phase of the input signal IN, and the phase of the processed signal SP_2 is the same as the phase of the input signal IN. In this case, the phase of the processed signal SP_4 is the same as the phase of the processed signal SP_1, and the phase of the processed signal SP_3 is the same as the phase of the processed signal SP_2.

In other embodiments, the high-voltage NMOS transistors HV_N1 and HV_N2 are coupled to a processing circuit 120. The processing circuit 120 generates an output signal SO based on the voltages of the drains of the high-voltage NMOS transistors HV_N1 and HV_N2. The processing circuit 120 may comprise high-voltage PMOS transistors HV_P1 and HV_P2. The sources of the high-voltage PMOS transistors HV_P1 and HV_P2 receive the operation voltage VDDH. The gate of the high-voltage PMOS transistor HV_P1 is coupled to the drain of the high-voltage NMOS transistor HV_N2 and an output node OUT_2. The drain of the high-voltage PMOS transistor HV_P1 is coupled to the drain of the high-voltage NMOS transistor HV_N1 and an output node OUT_1. The gate of the high-voltage PMOS transistor HV_P2 is coupled to the output node OUT_1. The drain of the high-voltage PMOS transistor HV_P2 is coupled to the output node OUT_2.

In some embodiments, the operation voltage VDDH is higher than the operation voltage VDDL. The components of the processing circuit 120 are manufactured using high-voltage processes. Since the high-voltage PMOS transistors HV_P1 and HV_P2 receive the operation voltage VDDH, the processing circuit 120 is referred to as a high-voltage area circuit.

In one embodiment, the accelerating switch circuit 110 and the processing circuit 120 constitute a level shifter circuit 100. The level shifter circuit 100 may be a bootstrap circuit. The voltage level of the output node OUT_1 serves as the output signal SO of the level shifter circuit 100. In another embodiment, the processing circuit 120 further comprises an inverter 121. The inverter 121 inverts the voltage level of the output node OUT_2. In this case, the output of the inverter 121 serves as the output signal SO of the level shifter circuit 100.

FIG. 2 is an operation schematic diagram of an exemplary embodiment of a level shifter circuit based on various aspects of the present invention. When the input signal IN is at a first high level (e.g., equal to the operation voltage VDDL), the accelerating switch circuit 110 turns off the high-voltage NMOS transistor HV_N1 via the control voltage VX and turns on the high-voltage NMOS transistor HV_N2 via the control voltage VY. In this embodiment, when the input signal IN changes from a low level (e.g., 0V) to a first high level (e.g., VDDH), the accelerating switch circuit 110 applies a negative voltage-AV to the control voltage VX, and applies a positive voltage +ΔV to the control voltage VY. Therefore, the high-voltage NMOS transistor HV_N1 quickly enters a turn-off stage, and the high-voltage NMOS transistor HV_N2 quickly enters a turn-on stage.

The high-voltage NMOS transistor HV_N2 transmits the processed signal SP_4 to the output node OUT_2. At this time, since the phase of the processed signal SP_4 is the opposite of the phase of the input signal IN, the voltage level of the output node OUT_2 is a low level. Therefore, the high-voltage PMOS transistor HV_P1 is turned on so that the voltage level of the output node OUT_1 is a second high level. In one embodiment, the second high level is equal to the level of the operation voltage VDDH.

When the voltage level of the input signal IN is a first low level, the accelerating switch circuit 110 uses the control voltage VX to turn on the high-voltage NMOS transistor HV_N1 and uses the control voltage VY to turn off the high-voltage NMOS transistor HV_N2. In this embodiment, when the input signal IN changes from a first high level (e.g., VDDH) to a low level (e.g., 0V), the accelerating switch circuit 110 applies a positive voltage +ΔV to the control voltage VX, and applies a negative voltage-AV to the control voltage VY. Therefore, the high-voltage NMOS transistor HV_N2 quickly enters a turn-off stage from a turn-on stage, and the high-voltage NMOS transistor HV_N2 quickly enters a turn-on stage from a turn-off stage.

The high-voltage NMOS transistor HV_N1 transmits the processed signal SP_3 to the output node OUT_1. At this time, since the phase of the processed signal SP_3 is the same as the phase of the input signal IN, the voltage level of the output node OUT_1 is a low level (e.g., 0V). In this case, the high-voltage PMOS transistor HV_P2 is turned on so that the voltage level of the output node OUT_2 may be equal to the operation voltage VDDH.

The bias-voltage generation circuit 111 automatically adjusts the appropriate stable voltage VA based on the operating voltages VDDH and VDDL. The charge-discharge balancer circuit 115 appropriately adjusts the control voltages VX and VY based on the processing signals SP_1 and SP_2. Taking the high-voltage NMOS transistor HV_N1 as an example, when the high-voltage NMOS transistor HV_N1 is required to be turned on, the charge-discharge balancer circuit 115 applies a positive voltage +ΔV to the control voltage VX. In this case, when the high-voltage NMOS transistor HV_N1 is required to be turned off, the charge-discharge balancer circuit 115 applies a negative voltage −ΔV to the control voltage VX to reduce the switching time of the high-voltage NMOS transistor HV_N1. In one embodiment, the level shifter circuit 100 can be referred to as an enhanced auto-adjustable level shifter with bootstrap circuit.

Figure 3A:
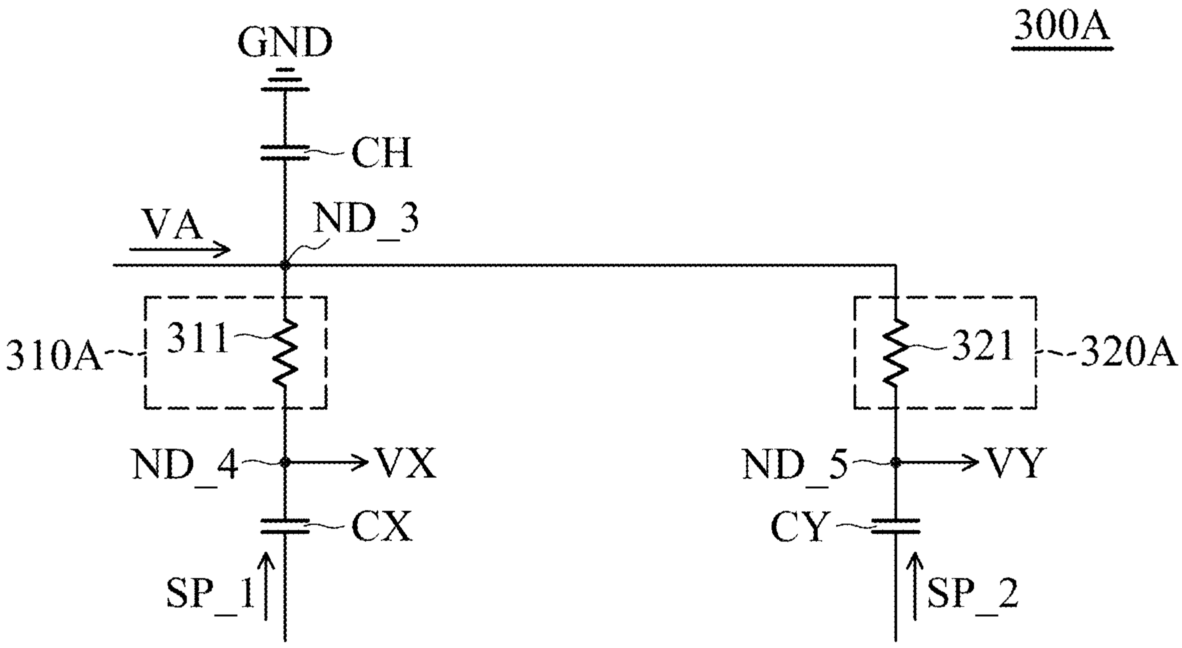
FIG. 3A is a schematic diagram of an exemplary embodiment of a charge-discharge balancer circuit based on various aspects of the present invention.

FIG. 3A is a schematic diagram of an exemplary embodiment of the charge-discharge balancer circuit based on various aspects of the present invention. The charge-discharge balancer circuit 300 comprises capacitors CH, CX, and CY, and resistance elements 310A and 320A. The capacitor CH is coupled between the node ND_3 and the ground node GND. In this embodiment, the node ND_3 is coupled to the node ND_1 of FIG. 1 to receive the stable voltage VA. The resistance element 310A is coupled between the nodes ND_3 and ND_4. The node ND_4 is coupled to the gate of the high-voltage NMOS transistor HV_N1 of FIG. 1 to provide the control voltage VX. The capacitor CX is coupled to the node ND_4 and receives the processed signal SP_1. The resistance element 320A is coupled between the nodes ND_3 and ND_5. The node ND_5 is coupled to the gate of the high-voltage NMOS transistor HV_N2 of FIG. 1 to provide the control voltage VY. The capacitor CY is coupled to the node ND_5 and receives the processed signal SP_2.

The kinds of resistance elements 310A and 320A are not limited in the present invention. In this embodiment, the resistance element 310A is a resistor 311, and the resistance element 320A is a resistor 321. As shown in FIG. 3A, the resistor 311 is directly connected between the nodes ND_3 and ND_4, and the resistor 321 is directly connected between the nodes ND_3 and ND_5. In some embodiments, by controlling the resistance of resistors 311 and 321, the speed at which the control voltages VX and VY return to the stable voltage VA can be adjusted.

Figure 3B:
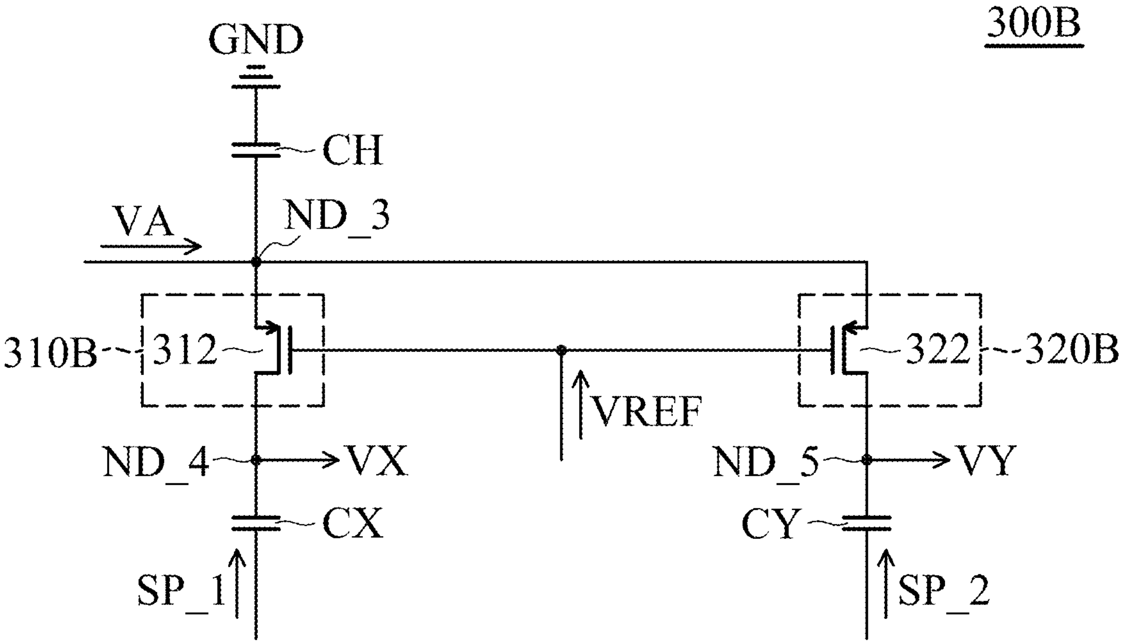
FIG. 3B is a schematic diagram of another exemplary embodiment of the charge-discharge balancer circuit based on various aspects of the present invention.

FIG. 3B is a schematic diagram of another exemplary embodiment of the charge-discharge balancer circuit based on various aspects of the present invention. The charge-discharge balancer circuit 300 comprises the capacitors CH, CX, and CY, and resistance elements 310B and 320B. In this embodiment, the resistance element 310B is a PMOS transistor 312, and the resistance element 320B is a PMOS transistor 322.

The gate of the PMOS transistor 312 receives a reference signal VREF. The source of the PMOS transistor 312 is coupled to the node ND_3. The drain of the PMOS transistor 312 is coupled to the node ND_4. The gate of the PMOS transistor 322 receives the reference signal VREF. The source of the PMOS transistor 322 is coupled to the ND_3. The drain of the PMOS transistor 322 is coupled to the node ND_5.

Figure 4A:
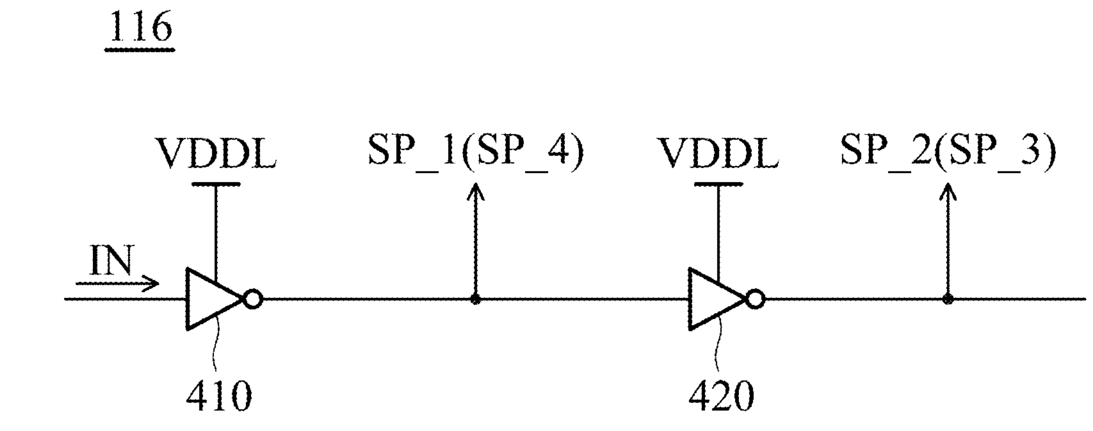
FIG. 4A is a schematic diagram of an exemplary embodiment of a processing circuit based on various aspects of the present invention.

FIG. 4A is a schematic diagram of an exemplary embodiment of the processing circuit 116 based on various aspects of the present invention. The processing circuit 116 comprises inverters 410 and 420. The inverters 410 and 420 receive the operation voltage VDDL. In some embodiments, since the inverters 410 and 420 receive the operation voltage VDDL, the processing circuit 116 can be referred to as a low-voltage area circuit.

In this embodiment, the inverter 410 inverts the input signal IN to generate the processed signal SP_1. The inverter 420 inverts the processed signal SP_1 to generate the processed signal SP_2. In other embodiments, the processed signal SP_1 serves as the processed signal SP_4, and the processed signal SP_2 serves as the processed signal SP_3.

Figure 4B:
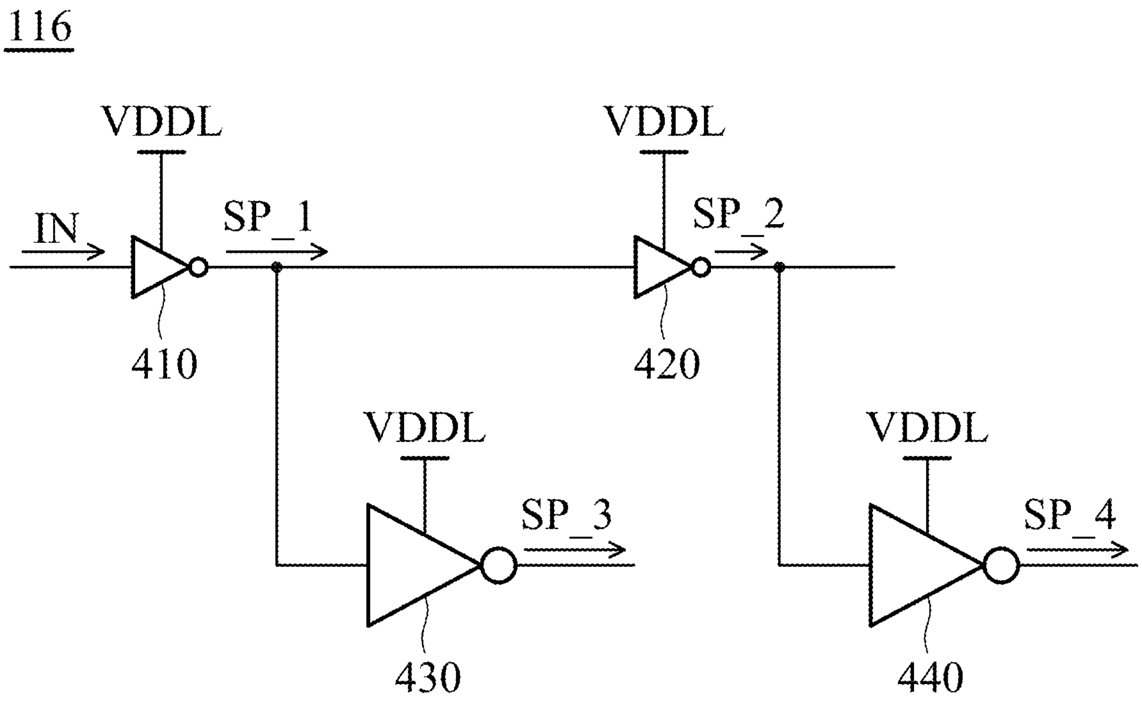
FIG. 4B is a schematic diagram of another exemplary embodiment of the processing circuit based on various aspects of the present invention.

FIG. 4B is a schematic diagram of another exemplary embodiment of the processing circuit 116 based on various aspects of the present invention. FIG. 4B is similar to FIG. 4A except for the addition of buffers 430 and 440. The buffer 430 is coupled to the output of the inverter 410 and inverts the processed signal SP_1 to generate the processed signal SP_3. In this case, the buffer 430 provides the processed signal SP_3 to the source of the high-voltage NMOS transistor HV_N1 of FIG. 1. The buffer 440 is coupled to the output of the inverter 420 and inverts the processed signal SP_2 to generate the processed signal SP_4. In this case, the buffer 440 provides the processed signal SP_4 to the source of the high-voltage NMOS transistor HV_N2 of FIG. 1.

Figure 4C:
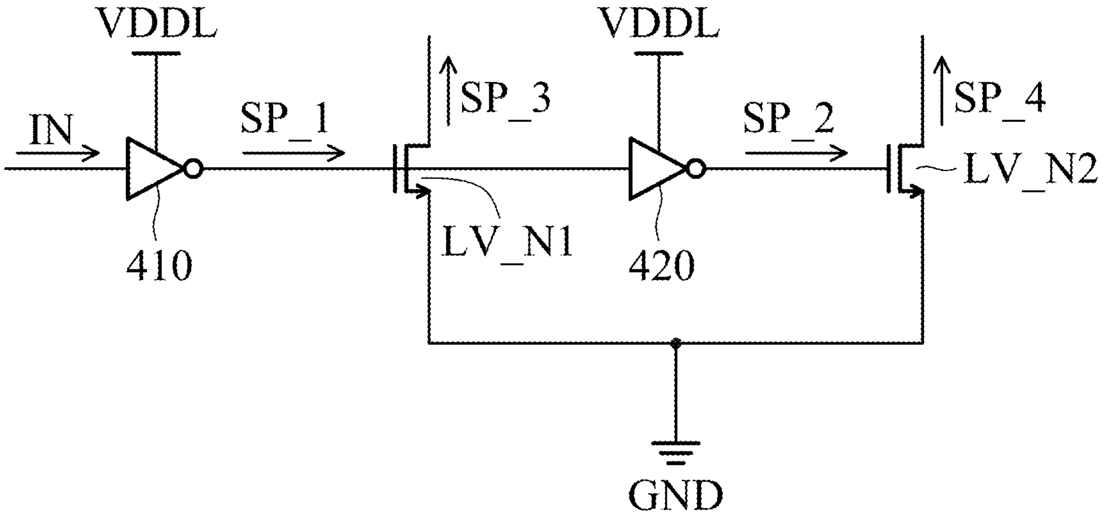
FIG. 4C is a schematic diagram of another exemplary embodiment of the processing circuit based on various aspects of the present invention.

FIG. 4C is a schematic diagram of another exemplary embodiment of the processing circuit 116 based on various aspects of the present invention. FIG. 4C is similar to FIG. 4A except for the addition of low-voltage NMOS transistors LV_N1 and LV_N2. The gate of the low-voltage NMOS transistor LV_N1 receives the processed signal SP_1. The drain of the low-voltage NMOS transistor LV_N1 is coupled to the source of the high-voltage NMOS transistor HV_N1 of FIG. 1 to provide the processed signal SP_3. The source of the low-voltage NMOS transistor LV_N1 is coupled to the ground node GND. The gate of the low-voltage NMOS transistor LV_N2 receives the processed signal SP_2. The drain of the low-voltage NMOS transistor LV_N2 provides the processed signal SP_4 to the source of the high-voltage NMOS transistor HV_N2 of FIG. 1. The source of the low-voltage NMOS transistor LV_N2 is coupled to the ground node GND.

In one embodiment, the threshold voltage of the low-voltage NMOS transistor LV_N1 is equal to the threshold voltage of the low-voltage NMOS transistor LV_N2 and lower than the threshold voltages of the high-voltage NMOS transistors HV_N1 and HV_N2 of FIG. 1. In another embodiment, the threshold voltage of the low-voltage NMOS transistor LV_N1 is also lower than the threshold voltage of the high-voltage NMOS transistor HV_N3 of FIG. 1. The threshold voltage of the high-voltage NMOS transistor HV_N3 may be equal to the threshold voltage of the high-voltage NMOS transistor HV_N1. In other embodiments, the threshold voltage of the high-voltage NMOS transistor HV_N1 is equal to the threshold voltage of the high-voltage NMOS transistor HV_N2.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will be understood that although the terms "first," "second," etc. may be used herein to describe various elements, these elements should not be limited by these terms. These terms are only used to distinguish one element from another. In the following claims, the terms "first," "second," etc. are used merely as labels, and are not intended to impose numerical requirements on their objects.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A level shifter circuit, comprising:
a bias-voltage generation circuit generating a stable voltage based on a first operation voltage and a second operation voltage;
a charge-discharge balancer circuit generating a first control voltage based on the stable voltage and a first processed signal and generating a second control voltage based on the stable voltage and a second processed signal;
a first high-voltage NMOS transistor comprising a gate receiving the first control voltage and further comprising a source receiving a third processed signal;
a second high-voltage NMOS transistor comprising a gate receiving the second control voltage and further comprising a source receiving a fourth processed signal;
a low-voltage processing circuit receiving the second operation voltage and processing an input signal to provide the first processed signal, the second processed signal, the third processed signal, and the fourth processed signal; and
a high-voltage processing circuit receiving the first operation voltage and generating an output signal based on a voltage of a drain of the first high-voltage NMOS transistor and a voltage of a drain of the second high-voltage NMOS transistor,
wherein a phase of the first processed signal and a phase of the fourth processed signal are the opposite of a phase of the input signal, and a phase of the second processed signal and a phase of the third processed signal are the same as the phase of the input signal.

2. The level shifter circuit as claimed in claim 1, wherein the charge-discharge balancer circuit comprises:
a first capacitor coupled to the gate of the first high-voltage NMOS transistor and receiving the first processed signal;
a first resistance element coupled between a first node and the gate of the first high-voltage NMOS transistor;
a second capacitor coupled to the gate of the second high-voltage NMOS transistor and receiving the second processed signal;
a second resistance element coupled between a first node and the gate of the second high-voltage NMOS transistor; and
a third capacitor coupled between the first node and a ground node.

3. The level shifter circuit as claimed in claim 2, wherein the first resistance element is a first resistor, and the second resistance element is a second resistor.

4. The level shifter circuit as claimed in claim 2, wherein:
the first resistance element is a first PMOS transistor, and the second resistance element is a second PMOS transistor,
a gate of the first PMOS transistor receives a reference signal, a source of the first PMOS transistor is coupled to the first node, and a drain of the first PMOS transistor is coupled to the gate of the first high-voltage NMOS transistor,
a gate of the second PMOS transistor receives a reference signal, a source of the second PMOS transistor is coupled to the first node, and a drain of the second PMOS transistor is coupled to the gate of the second high-voltage NMOS transistor.

5. The level shifter circuit as claimed in claim 2, wherein the bias-voltage generation circuit comprises:

a current source receiving the first operation voltage;
a third resistor coupled between the current source and the first node;
a fourth resistor coupled between the first node and a second node; and
a third high-voltage NMOS transistor coupled to the second node and receiving the second operation voltage.

6. The level shifter circuit as claimed in claim 1, wherein the low-voltage processing circuit comprises:
a first inverter receiving the second operation voltage and inverting the input signal to generate the first processed signal; and
a second inverter receiving the second operation voltage and inverting the first processed signal to generate the second processed signal.

7. The level shifter circuit as claimed in claim 6, wherein the low-voltage processing circuit further comprises:
a first buffer coupled between the first inverter and the source of the first high-voltage NMOS transistor; and
a second buffer coupled between the second inverter and the source of the second high-voltage NMOS transistor.

8. The level shifter circuit as claimed in claim 6, wherein the low-voltage processing circuit further comprises:
a first low-voltage NMOS transistor comprising:
a gate receiving the first processed signal;
a drain coupled to the source of the first high-voltage NMOS transistor; and
a source coupled to a ground node; and
a second low-voltage NMOS transistor comprising:
a gate receiving the second processed signal;
a drain coupled to the source of the second high-voltage NMOS transistor; and
a source coupled to the ground node.

9. The level shifter circuit as claimed in claim 8, wherein a threshold voltage of the first high-voltage NMOS transistor is equal to a threshold voltage of the second high-voltage NMOS transistor, a threshold voltage of the first low-voltage NMOS transistor is equal to a threshold voltage of the second low-voltage NMOS transistor, and the threshold voltage of the first high-voltage NMOS transistor is higher than the threshold voltage of the first low-voltage NMOS transistor.

10. The level shifter circuit as claimed in claim 1, further comprising:
an output buffer coupled to the drain of the second high-voltage NMOS transistor to generate the output signal.

11. The level shifter circuit as claimed in claim 1, wherein the high-voltage processing circuit comprises:
a third PMOS transistor comprising:
a source receiving the first operation voltage;
a gate coupled to the drain of the second high-voltage NMOS transistor; and
a drain coupled to the drain of the first high-voltage NMOS transistor; and
a fourth PMOS transistor comprising:
a source receiving the first operation voltage;
a gate coupled to the drain of the first high-voltage NMOS transistor; and
a drain coupled to the drain of the second high-voltage NMOS transistor.

12. An accelerating switch circuit controlling a first high-voltage NMOS transistor and a second high-voltage NMOS transistor, comprising:
a bias-voltage generation circuit generating a stable voltage based on a first operation voltage and a second operation voltage;
a charge-discharge balancer circuit generating a first control voltage based on the stable voltage and a first processed signal, and generating a second control voltage based on the stable voltage and a second processed signal; and
a processing circuit receiving the second operation voltage and processing an input signal to generate the first processed signal, the second processed signal, a third processed signal, and a fourth processed signal,
wherein:
a gate of the first high-voltage NMOS transistor receives the first control voltage, and a source of the first high-voltage NMOS transistor receives the third processed signal,
a gate of the second high-voltage NMOS transistor receives the second control voltage, and a source of the second high-voltage NMOS transistor receives the fourth processed signal,
a phase of the first processed signal and a phase of the fourth processed signal are the opposite of a phase of the input signal, and a phase of the second processed signal and a phase of the third processed signal are the same as the phase of the input signal.

13. The accelerating switch circuit as claimed in claim 12, wherein the charge-discharge balancer circuit comprises:
a first capacitor coupled to the gate of the first high-voltage NMOS transistor and receiving the first processed signal;
a first resistance element coupled between a first node and the gate of the first high-voltage NMOS transistor;
a second capacitor coupled to the gate of the second high-voltage NMOS transistor and receiving the second processed signal;
a second resistance element coupled between a first node and the gate of the second high-voltage NMOS transistor; and
a third capacitor coupled between the first node and a ground node.

14. The accelerating switch circuit as claimed in claim 13, wherein the first resistance element is a first resistor, and the second resistance element is a second resistor.

15. The accelerating switch circuit as claimed in claim 13, wherein:
the first resistance element is a first PMOS transistor, and the second resistance element is a second PMOS transistor,
a gate of the first PMOS transistor receives a reference signal, a source of the first PMOS transistor is coupled to the first node, and a drain of the first PMOS transistor is coupled to the gate of the first high-voltage NMOS transistor,
a gate of the second PMOS transistor receives a reference signal, a source of the second PMOS transistor is coupled to the first node, and a drain of the second PMOS transistor is coupled to the gate of the second high-voltage NMOS transistor.

16. The accelerating switch circuit as claimed in claim 13, wherein the bias-voltage generation circuit comprises:
a current source receiving the first operation voltage;
a third resistor coupled between the current source and the first node;
a fourth resistor coupled between the first node and a second node; and a third high-voltage NMOS transistor coupled to the second node and receiving the second operation voltage.

17. The accelerating switch circuit as claimed in claim 12, wherein the processing circuit comprises:

a first inverter receiving the second operation voltage and inverting the input signal to generate the first processed signal; and a second inverter receiving the second operation voltage and inverting the first processed signal to generate the second processed signal.

18. The accelerating switch circuit as claimed in claim 17, wherein the processing circuit further comprises:

a first buffer coupled between the first inverter and the source of the first high-voltage NMOS transistor; and a second buffer coupled between the second inverter and the source of the second high-voltage NMOS transistor.

19. The accelerating switch circuit as claimed in claim 17, wherein the processing circuit further comprises:

a first low-voltage NMOS transistor comprising:

a gate receiving the first processed signal;

a drain coupled to the source of the first high-voltage NMOS transistor; and a source coupled to a ground node; and a second low-voltage NMOS transistor comprising:

a gate receiving the second processed signal;

a drain coupled to the source of the second high-voltage NMOS transistor; and a source coupled to the ground node.

20. The accelerating switch circuit as claimed in claim 19, wherein a threshold voltage of the first high-voltage NMOS transistor is equal to a threshold voltage of the second high-voltage NMOS transistor, a threshold voltage of the first low-voltage NMOS transistor is equal to a threshold voltage of the second low-voltage NMOS transistor, and the threshold voltage of the first high-voltage NMOS transistor is higher than the threshold voltage of the first low-voltage NMOS transistor.

* * * * *